US009842989B2

(12) United States Patent
Tahmasebi et al.

(10) Patent No.: US 9,842,989 B2
(45) Date of Patent: Dec. 12, 2017

(54) MAGNETIC MEMORY WITH HIGH THERMAL BUDGET

(71) Applicant: GLOBALFOUNDRIES Singapore Pte. Ltd., Singapore (SG)

(72) Inventors: Taiebeh Tahmasebi, Singapore (SG); Kah Wee Gan, Singapore (SG); Chim Seng Seet, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/057,107

(22) Filed: Feb. 29, 2016

(65) Prior Publication Data

US 2016/0254444 A1 Sep. 1, 2016

Related U.S. Application Data

(60) Provisional application No. 62/121,494, filed on Feb. 27, 2015, provisional application No. 62/135,720, filed on Mar. 20, 2015.

(51) Int. Cl.

| H01L 43/12 | (2006.01) |
|---|---|
| H01L 43/08 | (2006.01) |
| H01L 43/10 | (2006.01) |
| H01L 27/22 | (2006.01) |
| H01L 43/02 | (2006.01) |

(52) U.S. Cl.
CPC ............ *H01L 43/12* (2013.01); *H01L 27/228* (2013.01); *H01L 43/02* (2013.01); *H01L 43/08* (2013.01); *H01L 43/10* (2013.01)

(58) Field of Classification Search
CPC ......... H01L 43/02; H01L 43/08; H01L 43/10; H01L 43/12; H01L 27/228
See application file for complete search history.

(56) References Cited

U.S. PATENT DOCUMENTS

| 6,960,480 B1* | 11/2005 | Horng | ................. B82Y 25/00 257/E43.004 |
|---|---|---|---|
| 2004/0174740 A1* | 9/2004 | Lee | ................. B82Y 10/00 365/171 |
| 2011/0014500 A1* | 1/2011 | Horng | ................. C23C 14/3414 428/846.3 |
| 2011/0293967 A1* | 12/2011 | Zhang | ................. G11B 5/66 428/827 |

(Continued)

OTHER PUBLICATIONS

Long You et. al., Co/Ni multilayers with perpendicular anisotropy for spintronic device applications, Applied Physics Letters 100, Apr. 26, 2012, pp. 172411-1-172411-4, 100-172411, AIP Publishing, Melville, NY.

(Continued)

*Primary Examiner* — Marvin Payen
*Assistant Examiner* — Jeremy Joy
(74) *Attorney, Agent, or Firm* — Horizon IP Pte Ltd.

(57) ABSTRACT

A magnetic memory having a base layer with a wetting layer and seed layer is disclosed. The wetting layer and seed layer promotes FCC structure along the (111) orientation to improve PMA. The seed layer includes first and second seed layer separated by a surface smoother, such as a surfactant layer. This enhances the smoothness of the seed layer, resulting in smoother interface in the MTJ stack, which leads to improved thermal endurance.

20 Claims, 20 Drawing Sheets

(56) References Cited

U.S. PATENT DOCUMENTS

| | | | | |
|---|---|---|---|---|
| 2012/0292724 A1* | 11/2012 | Lim | ........................ | H01L 43/08 |
| | | | | 257/421 |
| 2013/0075837 A1* | 3/2013 | Chen | ...................... | H01L 43/08 |
| | | | | 257/421 |
| 2014/0070341 A1* | 3/2014 | Beach | .................... | H01L 29/82 |
| | | | | 257/421 |
| 2014/0103469 A1* | 4/2014 | Jan | .......................... | H01L 43/10 |
| | | | | 257/421 |
| 2014/0145792 A1* | 5/2014 | Wang | ................. | H01F 10/3272 |
| | | | | 331/94.1 |
| 2014/0197504 A1* | 7/2014 | Moriyama | ............ | G11C 11/161 |
| | | | | 257/421 |
| 2014/0306302 A1* | 10/2014 | Jan | .......................... | H01L 43/10 |
| | | | | 257/421 |
| 2015/0008547 A1* | 1/2015 | Pi | ............................ | H01L 43/04 |
| | | | | 257/421 |
| 2015/0008550 A1* | 1/2015 | Min | ........................ | H01F 10/32 |
| | | | | 257/421 |
| 2015/0061058 A1* | 3/2015 | Jan | ....................... | G01R 33/098 |
| | | | | 257/421 |
| 2015/0171316 A1* | 6/2015 | Park | ........................ | H01L 43/10 |
| | | | | 257/421 |
| 2016/0043309 A1* | 2/2016 | Annunziata | ......... | G11C 11/1675 |
| | | | | 438/3 |

OTHER PUBLICATIONS

H. Kurt et al., Enhanced perpendicular magnetic anisotropy in Co/Ni multilayers with a thin seed layer, Journal of Applied Physics 108, Oct. 7, 2010, pp. 073916-1-073916-4, 108-073916, AIP Publishing, Melville, NY.

\* cited by examiner

700

MAGNETIC MEMORY WITH HIGH THERMAL BUDGET

CROSS-REFERENCE TO RELATED APPLICATIONS

This application claims the priority benefits of U.S. Provisional Application Ser. No. 62/121,494, filed on Feb. 27, 2015 and U.S. Provisional Application Ser. No. 62/135,720, filed on Mar. 20, 2015, and this application cross-references to U.S. patent application Ser. No. 15/057,109, concurrently filed on Feb. 29, 2016, the disclosures of which are herein incorporated by reference in their entirety for all purposes.

BACKGROUND

A magnetic memory cell or device stores information by changing electrical resistance of a magnetic tunnel junction (MTJ) element. The MTJ element typically includes a thin insulating tunnel barrier layer sandwiched between a magnetically fixed layer and a magnetically free layer, forming a magnetic tunnel junction. Magnetic orientations of the fixed and free layers may be in a vertical direction, forming a perpendicular MTJ (or pMTJ) element. The pMTJ element could be either in a bottom pinned pMTJ element or a top pinned pMTJ element. The bottom pinned pMTJ element is formed by having the magnetically fixed layer disposed below the magnetically free layer while the top pinned pMTJ element is formed by having the fixed layer disposed above the free layer. In order to obtain strong perpendicular magnetic anisotropy (PMA) for the fixed layer, a well crystal orientation of the fixed layer is required. Several conventional techniques have been proposed to improve PMA for the fixed layer. However, these conventional techniques undesirably lead to reduced thermal budget and thermal endurance of the pMTJ stack.

In view of the foregoing, it is desirable to provide a pMTJ element with improved PMA and enhanced thermal endurance and thermal budget. Furthermore, it is also desirable to provide a process for forming such pMTJ element which is cost effective and compatible with logic processing.

SUMMARY

Embodiments of the present disclosure generally relate to semiconductor devices and methods for forming a semiconductor device. In one embodiment, a method of forming a memory cell is disclosed. The method includes forming a select unit on a substrate. The select unit includes a transistor having a first source/drain (S/D) region, a second S/D region, and a gate between the first and second S/D regions. A dielectric layer is formed on the substrate covering the select unit. The dielectric layer includes storage pad coupled to the first S/D region. A storage unit is formed on the storage pad. Forming the storage unit includes forming a bottom electrode and forming a fixed layer over the bottom electrode. The fixed layer includes a hard layer disposed over a base layer. The base layer promotes face-centered cubic (FCC) structure along (111) orientation to increase perpendicular anisotropy. The base layer includes a wetting layer and a seed layer. The seed layer includes a first seed layer, a roughness smoother to improve surface smoothness of the first seed layer and a second seed layer formed over the roughness smoother. The roughness smoother improves surface smoothness of the second seed layer. A hard layer is formed over the seed layer. Improved surface smoothness of the seed layer improves surface smoothness of the hard layer to improve thermal endurance. Forming the storage unit includes forming at least one tunneling barrier layer over the hard layer, forming a storage layer over the tunneling barrier layer, and forming a top electrode over the storage layer. The method also includes forming a bitline coupled to the top electrode layer.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIG. 7a-7l show cross-sectional views of an embodiment of a process for forming a memory cell

DETAILED DESCRIPTION

Embodiments of the present disclosure generally relate to memory cells or devices. In one embodiment, the memory cells are magnetoresistive memory cells. For example, the memory devices may be spin transfer torque magnetoresistive random access memory (STT-MRAM) devices. A magnetoresistive memory cell includes a magnetic tunneling junction (MTJ) storage unit. The MTJ storage unit of the present disclosure includes a base layer having a seed layer with roughness smoother or crystallinity enhancing layer and a wetting layer that provides an improved PMA of the fixed layer of the pMTJ stack and further enhances the thermal endurance and thermal budget of the pMTJ stack. Other suitable types of memory cells may also be useful. Such memory devices, for example, may be incorporated into standalone memory devices including, but not limited to, USB or other types of portable storage units, or ICs, such as microcontrollers or system on chips (SoCs). The devices or ICs may be incorporated into or used with, for example, consumer electronic products, or relate to other types of devices.

Figure 1:
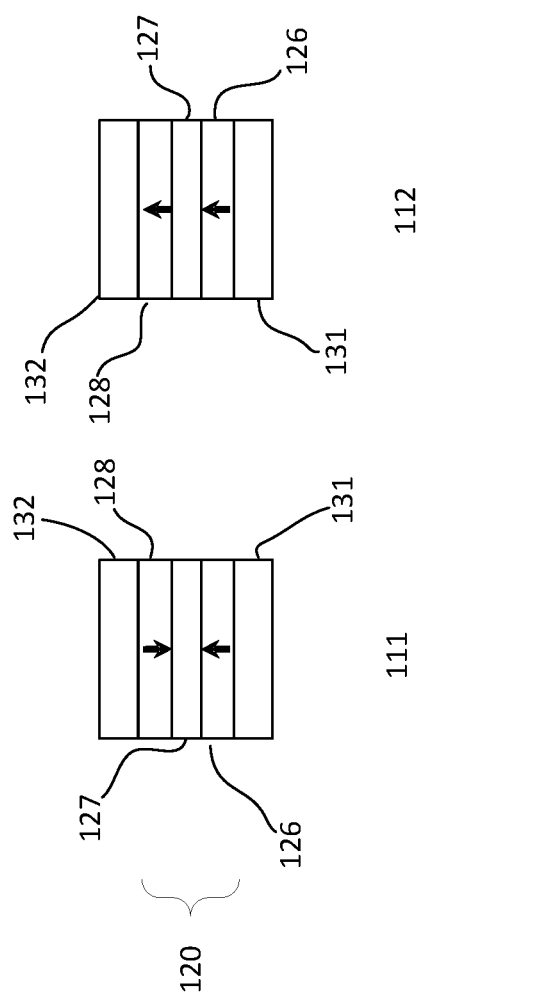
FIG. 1 shows simplified diagrams of parallel state and anti-parallel state of a bottom pinned perpendicular MTJ element of a magnetic memory cell.

FIG. 1 shows a simplified cross-sectional view of an embodiment of a bottom pinned perpendicular MTJ (pMTJ) unit 110 of a magnetic or memory cell. The MTJ unit includes a pMTJ element or stack 120 disposed between a bottom electrode 131 and a top electrode 132. The bottom electrode is proximate to the substrate on which the memory cell is formed while the top electrode is distal from the substrate.

The MTJ element includes a magnetically fixed (pinned) layer 126, a tunneling barrier layer 127 and a magnetically free layer 128. In one embodiment, the magnetically fixed layer is disposed below the magnetic free layer, forming a bottom pinned pMTJ stack. The magnetic orientation of the fixed layer is fixed in a first perpendicular direction. The term perpendicular direction, for example, refers to the direction which is perpendicular to the surface of a substrate or perpendicular to the plane of the layers of the MTJ element. As shown, the first perpendicular direction is in an upward direction away from the substrate. Providing the first perpendicular direction which is in a downward direction towards the substrate may also be useful. As for the magnetic orientation of the free layer, it may be programmed to be in a first or same direction as the fixed layer or in a second or opposite direction as the fixed layer.

For example, as shown by structure 111, the magnetic direction of the free layer is programmed to be in the second or anti-parallel direction to the fixed layer. The corresponding MTJ electrical resistance between the free layer 128 and the fixed layer 126 is denoted as $R_{AP}$. Structure 112 illustrates that the magnetization of the free layer is programmed to be in the first or parallel direction to the fixed layer. The corresponding MTJ electrical resistance between the free layer 128 and the fixed layer 126 is denoted as $R_P$. The resistance $R_{AP}$ is higher than the resistance $R_P$.

Figure 2:
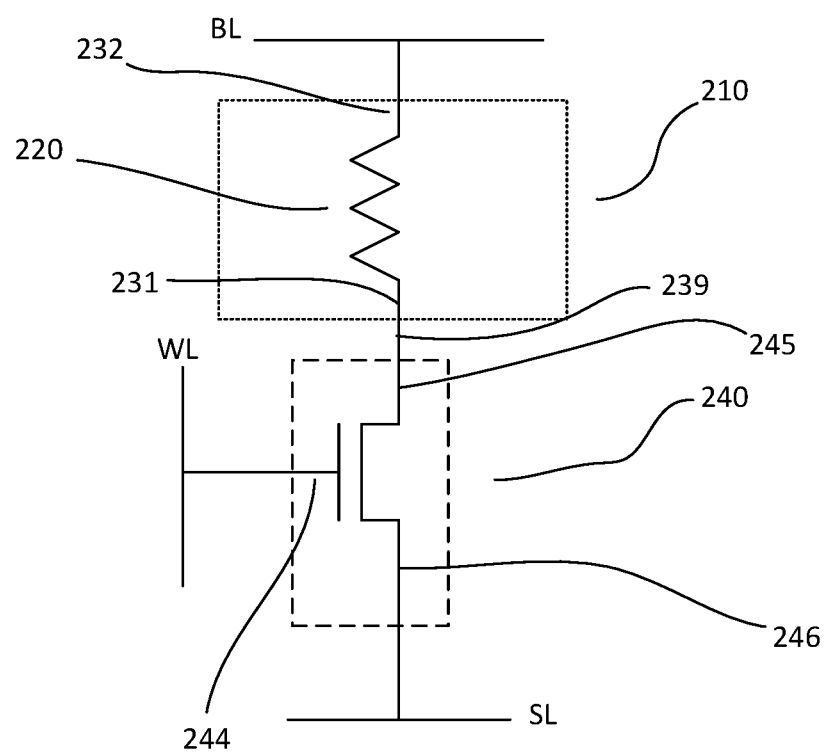
FIG. 2 shows a schematic diagram of an embodiment of a magnetic memory cell.

FIG. 2 shows a schematic diagram of an embodiment of a memory cell 200. The memory cell is a non-volatile memory cell. For example, the memory cell may be a magnetoresistive memory cell. In one embodiment, the memory cell is a Spin Transfer Torque-Magnetoresistive Random Access Memory (STT-MRAM) cell. Other suitable types of memory cells may also be useful. The memory cell includes a magnetic storage unit 210 and a cell selector unit 240. The storage unit is coupled to the cell selector unit. For example, the storage unit and cell selector unit are coupled at a first cell node 239 of the memory cell. The storage unit 210, in one embodiment, is a magnetic storage unit and includes a pMTJ element 220. The pMTJ element may be similar to that described in FIG. 1. Other suitable types of MTJ elements may also be useful.

The pMTJ element includes first and second electrodes 231 and 232. The first electrode, for example, may be a bottom electrode while the second electrode may be a top electrode. Other configurations of electrodes may also be useful. In one embodiment, the top electrode of the storage unit is electrically connected to a bit line (BL). The bottom electrode of the storage element is connected to the first cell node 239.

The cell selector unit includes a selector for selecting the memory cell. The selector, for example, may be a select transistor. In one embodiment, the select transistor is a metal oxide semiconductor (MOS) transistor. In one embodiment the selector is a n-type MOS transistor. The select transistor includes first and second source/drain (S/D) terminals 245 and 246 and a gate or control terminal 244. The first S/D terminal may be referred to as a drain and the second S/D terminal may be referred to as the source. The S/D terminals, for example, are heavily doped regions with first polarity type dopants, defining the first type transistor. For example, in the case of a n-type transistor, the S/D terminals are n-type heavily doped regions. Other types of transistors or selectors may also be useful.

In one embodiment, the first terminal of the cell selector and first electrode of the storage unit are commonly coupled at the first cell node. For example, the first S/D terminal of the cell selector is coupled to the bottom electrode of the storage unit. For example, the drain terminal is coupled to the storage unit. The second or source terminal of the cell selector is coupled to a source line (SL). As for the gate terminal, it is coupled to a wordline WL.

Figure 3:
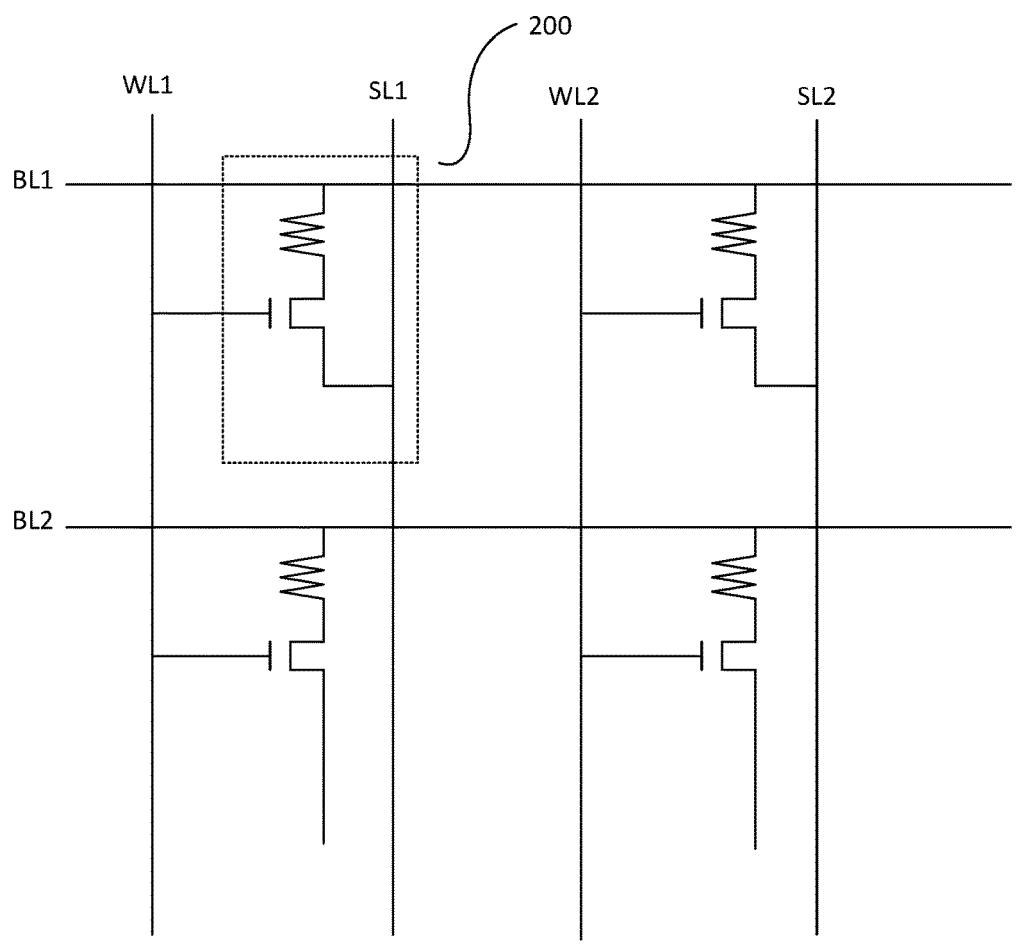
FIG. 3 shows an array of magnetic memory cells.

FIG. 3 shows a schematic diagram of an embodiment of a memory array 300. The array includes a plurality of memory cells 200 interconnected. The memory cells may be similar to those described in FIG. 2. For example, the memory cells are MRAM cells, such as STT-MRAM cells. Common elements may not be described or described in detail. Other suitable types of memory cells may also be useful.

As shown, the array includes four memory cells arranged in a 2×2 array. For example, the array is arranged to form two rows and two columns of memory cells. Memory cells of a row are interconnected by a wordline (WL1 or WL2) while memory cells of a column are interconnected by a bitline (BL1 or BL2). A second S/D or source terminal is coupled to a source line (SL1 or SL2). As shown, the SLs are in the row or wordline direction. Other suitable cell configurations may also be useful. Although the array is illustrated as a 2×2 array, it is understood that arrays of other sizes may also be useful.

Figure 4:
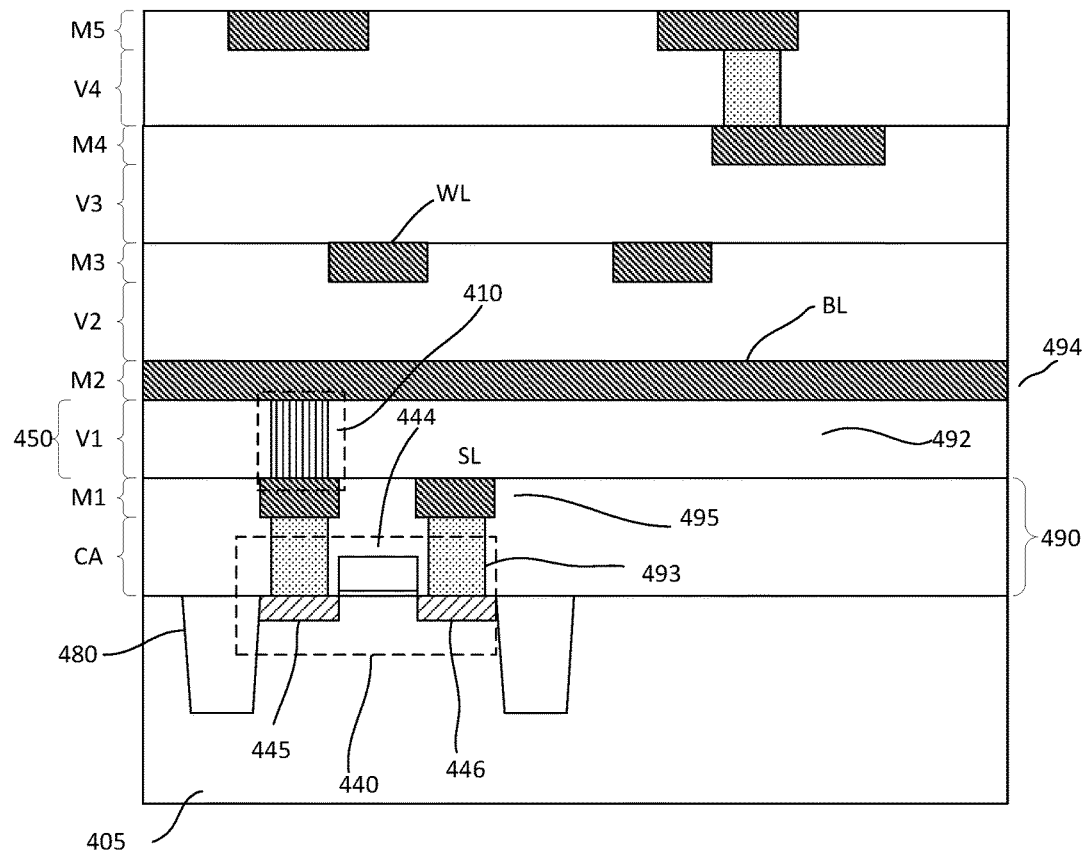
FIG. 4 shows a cross-sectional view of an embodiment of a memory cell.

FIG. 4 shows a cross-sectional view of an exemplary embodiment of a memory cell 400 of a device. The cross-sectional view, for example is along a second or bitline direction of the device. The device, as shown, includes a memory cell 400. The memory cell, for example, may be a NVM memory cell. The memory cell, in one embodiment, is a magnetoresistive NVM cell, such as a STT-MRAM cell. The memory cell, for example, is similar to that described in FIG. 2. Common elements may not be described or described in detail.

The memory cell is disposed on a substrate 405. For example, the memory cell is disposed in a cell region of the substrate. The cell region may be part of an array region. For example, the array region may include a plurality of cell regions. The substrate may include other types of device regions (not shown), such as high voltage (HV) as well as logic regions, including low voltage (LV) and intermediate voltage (IV) device regions. Other types of regions may also be provided.

The substrate, for example, is a semiconductor substrate, such as a silicon substrate. For example, the substrate may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, is formed from silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

Front-end-of-line (FEOL) processing is performed on the substrate. The FEOL process, for example, forms n-type and p-type devices or transistors on the substrate. The p-type and n-type device form a complementary MOS (CMOS) device. The FEOL processing, for example, includes forming isolation regions, various device and isolation wells, transistor gates and transistor source/drain (S/D) regions and contact or diffusion regions serving as substrate or well taps. Forming other components with the FEOL process may also be useful.

Isolation regions 480, for example, serve to isolate different device regions. The isolation regions may be shallow trench isolation (STI) region. To form STI regions, trenches are formed and filled with isolation material. A planarization process, such as chemical mechanical polishing (CMP) is performed to remove excess dielectric material, forming isolation regions. Other types of isolation regions may also be useful. The isolation regions are provided to isolate device regions from other regions.

Device wells, for example, serve as bodies of p-type and n-type transistors. Device wells are doped wells. Second type doped device wells serve as bodies of first type transistors. For example, p-type device wells serve as bodies of n-type transistors and n-type device wells serve as bodies of p-type transistors. Isolation wells may be used to isolate device wells from the substrate. The isolation wells are deeper than the device wells. For example, isolation wells encompass the device wells. The isolation wells are first type doped wells. For example, n-type isolation wells are used to isolate p-type device wells. Separate implants may be employed to form different doped device wells and isolation wells using, for example, implant masks, such as photoresist masks. The wells, for example, are formed after forming isolation regions.

Gates of transistors are formed on the substrate. For example, layers of the gate, such as gate dielectric and gate electrode are formed on the substrate and patterned to form the gates. The gate dielectric may be a silicon oxide layer while the gate electrode layer may be polysilicon. The gate electrode may be doped, for example, to reduce sheet resistance. Other types of gate dielectric and gate electrode layers may also be useful. The gate dielectric layer may be formed by thermal oxidation and the gate electrode layer may be formed by chemical vapor deposition (CVD). Separate processes may be performed for forming gate dielectrics of the different voltage transistors. This is due to, for example, different gate dielectric thicknesses associated with the different voltage transistors. For example, HV transistor will have a thicker gate dielectric than a LV transistor.

The gate layers are patterned by, for example, mask and etch techniques. For example, a patterned photoresist mask may be provided over the gate layers. For example, a photoresist layer is formed over the gate layers and lithographically exposed by using a reticle. The mask layer is developed, forming a patterned mask with the desired pattern of the reticle. To improve lithographic resolution, an anti-reflective coating (ARC) layer may be provided between the gate layer and resist mask layer. An anisotropic etch, such as a reactive ion etch (RIE) is used to pattern the gate layers to form the gates using the patterned mask layer.

Doped contact regions 445 and 446, such as source/drain (S/D) regions and well or substrate taps are formed in exposed active regions of the substrate after forming the gates. The contact regions are heavily doped regions. Depending on the type of transistor and well tap, the contact regions may be heavily doped n-type or p-type regions. For n-type transistors, S/D regions are heavily doped n-type regions and for p-type transistors, S/D regions are heavily doped p-type regions. For well taps, they are the same dopant type as the well.

A S/D region may include lightly doped diffusion (LDD) and halo regions. A LDD region is a lightly doped region with first polarity type dopants while the halo region is a lightly doped region with second polarity type dopants. For example, the halo region includes p-type dopants for a n-type transistor while the LDD region includes n-type dopants for n-type transistors. The halo and LDD regions extend under the gate. A halo region extends farther below the gate than a LDD region. Other configurations of LDD, halo and S/D regions may also be useful.

Dielectric spacers (not shown) may be provided on the gate sidewalls of the transistors. The spacers may be used to facilitate forming transistor halo, LDD and transistor S/D regions. For example, spacers are formed after halo and LDD regions are formed. Spacers may be formed by, for example, forming a spacer layer on the substrate and anisotropically etching it to remove horizontal portions, leaving the spacers on sidewalls of the gates. After forming the spacers, an implant is performed to form the S/D regions. Separate implants may be employed to form different doped regions using, for example, implant masks, such as photoresist mask. Well taps of the same dopant type as S/D regions are formed at the same time.

As shown, the FEOL processing forms a cell region isolated by an isolation region 480, such as a STI region. The cell region is for a memory cell. Isolation regions may be provided to isolate columns of memory cells. Other configurations of isolation regions may also be useful. The cell region may include a cell device well (not shown). The cell device well, for example, serves as a body well for a transistor of the memory cell. The device well may be doped with second polarity type dopants for first polarity type transistors. The device well may be lightly or intermediately doped with second polarity type dopants. In some cases, a cell device isolation well (not shown) may be provided, encompassing the cell device well. The isolation well may have a dopant type which has the opposite polarity to that of the cell device well. For example, the isolation well may include first polarity type dopants. The isolation well serves to isolate the cell device well from the substrate. Well biases may be provided to bias the wells.

The cell device well may be a common well for the cell regions in the array region. For example, the cell device well may be an array well. The cell device isolation well may serve as the array isolation well. Other configurations of device and isolation wells may also be useful. Other device regions of the device may also include device and/or device isolation wells.

The memory cell includes a cell selector unit 440 and a storage unit 410. The FEOL forms the cell selector in the cell region. The cell selector unit includes a selector for selecting the memory cell. The selector, for example, may be a select transistor. In one embodiment, the select transistor is a metal oxide semiconductor (MOS) transistor. The transistor, as shown, includes first and second source/drain (S/D) regions 445 and 446 formed in the substrate and a gate 444 disposed on the substrate between the S/D regions. The first S/D region may be referred to as a drain region and the second S/D region may be referred to as a source region. The S/D regions, for example, are heavily doped regions with first polarity type dopants, defining the first type transistor. For example, in the case of a n-type transistor, the S/D regions are n-type heavily doped regions. Other types of transistors or selectors may also be useful.

As for the gate, it includes a gate electrode over a gate dielectric. The gate electrode may be polysilicon while the gate dielectric may be silicon oxide. Other types of gate electrode and gate dielectric materials may also be useful. A gate, for example, may be a gate conductor along a first or wordline direction. The gate conductor forms a common gate for a row of memory cells.

As discussed, a S/D region may include LDD and halo regions (not shown). Dielectric spacers (not shown) may be provided on the gate sidewalls of the transistors to facilitate forming transistor halo, LDD and transistor S/D regions. It is understood that not all transistors include LDD and/or halo regions.

After forming the cell selector unit and other transistors, back-end-of-line (BEOL) processing is performed. The BEOL process includes forming interconnects in interlevel dielectric (ILD) layers 490. The interconnects connect the various components of the IC to perform the desired functions. An ILD layer includes a metal level 494 and a contact level 492. Generally, the metal level includes conductors or metal lines 495 while the contact level includes contacts 493. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE) may also be employed to form metal lines.

A device may include a plurality of ILD layers or levels. For example, x number of ILD levels may be provided. As illustrated, the device includes 5 ILD levels (x=5). Other number of ILD levels may also be useful. The number of ILD levels may depend on, for example, design requirements or the logic process involved. A metal level of an ILD level may be referred to as $M_i$, where i is from 1 to x and is the $i^{th}$ ILD level of x ILD levels. A contact level of an ILD level may be referred to as $V_{i-1}$, where i is the $i^{th}$ ILD level of x ILD levels.

The BEOL process, for example, commences by forming a dielectric layer over the transistors and other components formed in the FEOL process. The dielectric layer may be silicon oxide. For example, the dielectric layer may be silicon oxide formed by chemical vapor deposition (CVD). The dielectric layer serves as a premetal dielectric layer or first contact layer of the BEOL process. The dielectric layer may be referred to as CA level of the BEOL process. Contacts are formed in the CA level dielectric layer. The contacts may be formed by a single damascene process. Via openings are formed in the dielectric layer using mask and etch techniques. For example, a patterned resist mask with openings corresponding to the vias is formed over the dielectric layer. An anisotropic etch, such as RIE, is performed to form the vias, exposing contact regions below, such as S/D regions and gates. A conductive layer, such as tungsten is deposited on the substrate, filling the openings. The conductive layer may be formed by sputtering. Other techniques may also be useful. A planarization process, such as CMP, is performed to remove excess conductive material, leaving contact plugs in the CA level.

After forming contacts in the CA level, the BEOL process continues to form dielectric layer over the substrate, covering the CA level dielectric layer. The dielectric layer, for example, serves as a first metal level M1 of the first ILD layer. The upper dielectric layer, for example, is a silicon oxide layer. Other types of dielectric layers may also be useful. The dielectric layer may be formed by CVD. Other techniques for forming the dielectric layer may also be useful.

Conductive lines are formed in the M1 level dielectric layer. The conductive lines may be formed by a damascene technique. For example, the dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful. Excess conductive materials are removed by, for example, CMP, leaving planar surface with the conductive line and M1 dielectric. The first metal level M1 and CA may be referred as a lower ILD level.

The process continues to form additional ILD layers. For example, the process continues to form upper ILD layers or levels. The upper ILD levels may include ILD level 2 to ILD level x. For example, in the case where x=5 (5 levels), the upper levels include ILD levels from 2 to 5, which include via levels V1 to V4 and metal levels M2 to M5. The number of ILD layers may depend on, for example, design requirements or the logic process involved. The upper ILD layers may be formed of silicon oxide. Other types of dielectric materials, such as low k, high k or a combination of dielectric materials may also be useful. The ILD layers may be formed by, for example, CVD. Other techniques for forming the ILD layers may also be useful.

The conductors and contacts of the upper ILD layers may be formed by dual damascene techniques. For example, vias and trenches are formed, creating dual damascene structures. The dual damascene structure may be formed by, for example, via first or via last dual damascene techniques. Mask and etch techniques may be employed to form the dual damascene structures. The dual damascene structures are filled with a conductive layer, such as copper or copper alloy. The conductive layer may be formed by, for example, plating techniques. Excess conductive material is removed by, for example, CMP, forming conductors and contacts in an upper ILD layer.

A dielectric liner (not shown) may be disposed between ILD levels and on the substrate. The dielectric liner, for example, serves as an etch stop layer. The dielectric liner may be formed of a low k dielectric material. For example, the dielectric liner may be nBLOK. Other types of dielectric materials for the dielectric liner may also be useful.

The uppermost ILD level (e.g., M5) may have different design rules, such as critical dimension (CD), than the lower ILD levels. For example, Mx may have a larger CD than metal levels M1 to Mx−1 below. For example, the uppermost metal level may have a CD which is 2X or 6X the CD of the metal levels below. Other configurations of the ILD levels may also be useful.

As shown, S/D contacts are disposed in the CA level. The S/D contacts are coupled to the first and second S/D regions of the select transistor. Other S/D contacts to other S/D regions of transistors may also be provided. The CA level may include a gate contact (not shown) coupled to the gate of the select transistor. The gate contact may be disposed in another cross-section of the device. The contacts may be tungsten contacts while contact pads may be copper. Other types of contacts and contact pad may also be useful. Other S/D and gate contacts for other transistors may also be provided.

As described, metal lines are provided in M1. The metal lines are coupled to the S/D contacts. In one embodiment, a SL is coupled to the second S/D region of the select transistor. As for the first S/D contact, it may be coupled to contact pad or island in M1. The contact pads provide connections to upper ILD levels. The metal lines or contact pads may be formed of copper or copper alloy. Other types of conductive material may also be useful.

As for the upper ILD levels, for example, from 2 to 5, they include contacts in the via level and contact pads/metal lines in the metal level. The contacts and contact pads provide connection from M5 to the first S/D region of the select transistor.

A pad level (not shown) is disposed over the uppermost ILD level. For example, a pad dielectric level is disposed over Mx. In the case where the device includes 5 metal levels, the pad level is disposed over M5. The pad dielectric layer, for example, may be silicon oxide. Other types of dielectric materials may also be useful. The pad dielectric layer includes pads, such as bond pads or pad interconnects for providing external interconnections to the components. Bond pads may be used for wire bonding while pad interconnects may be provided for contact bumps. The external interconnections may be input/output (I/O), power and ground connections to the device. The pads, for example, may be aluminum pads. Other types of conductive pads may also be useful. A passivation layer, such as silicon oxide, silicon nitride or a combination thereof, may be provided over the pad level. The passivation layer includes openings to expose the pads.

A dielectric liner may be disposed between the uppermost metal level and pad level. The dielectric liner, for example, serves as an etch stop layer during via etch process and it may also serve as a diffusion barrier layer for, for example, copper (Cu) layer. The dielectric liner may be a low k dielectric liner. For example, the dielectric liner may be nBLOK. Other suitable types of dielectric materials for the dielectric liner may also be useful.

The storage unit 410 of the memory cell is disposed in a storage dielectric layer 450. The storage dielectric layer may be a via level of an ILD level. As shown, the storage dielectric layer is V1 of M2. Providing the storage dielectric layer at other via levels may also be useful. In other embodiments, the storage dielectric layer may be a dedicated storage dielectric layer and not part of an interconnect level. Other configurations of storage dielectric layer may also be useful. The storage unit 410 includes a storage element disposed between top and bottom electrodes, forming a pMTJ element. The storage element, in one embodiment, is a bottom pinned pMTJ storage element, such as that described in FIG. 1 and FIGS. 5a-5b and FIGS. 6a-6b as will be described later. Common elements may not be described or described in detail.

In one embodiment, the bottom electrode of the storage unit is coupled to a drain of the select transistor. For example, the bottom electrode is coupled to a contact pad in the M1 level and a via contact in the CA level. Other configurations of coupling the bottom electrode may also be useful. The top electrode is coupled to a BL. For example, the top electrode is coupled to the BL disposed in M2. The BL is along a bitline direction. As for the source of the select transistor, it is coupled to the SL. The SL, for example, may be in the first or wordline direction. Providing a SL in the second or bitline direction may also be useful. For example, a via contact in CA is provided to couple the source region to SL in M1. Providing SL in other levels may also be useful.

As for the gate of cell selector, it is coupled to a WL. The WL, for example, is along a wordline direction. The bitline and wordline directions are perpendicular to each other. As shown, the WL is disposed in M3. The WL may be coupled to the gate by contact pads in M2 and M1 and via contacts in V2 and V1 (not shown). Other configurations of coupling the WL to the gate may also be useful. For example, the WL may be disposed in other metal levels.

In general, lines which are parallel in a first direction may be formed in the same metal level while lines which are in a second direction perpendicular to the first may be formed in a different metal level. For example, WLs and BLs are formed in different metal levels.

As described, the cell dielectric 450 is disposed in V1 in between M1 and M2. It is understood that providing other configurations of cell dielectric layers may be also useful.

Figure 5A:
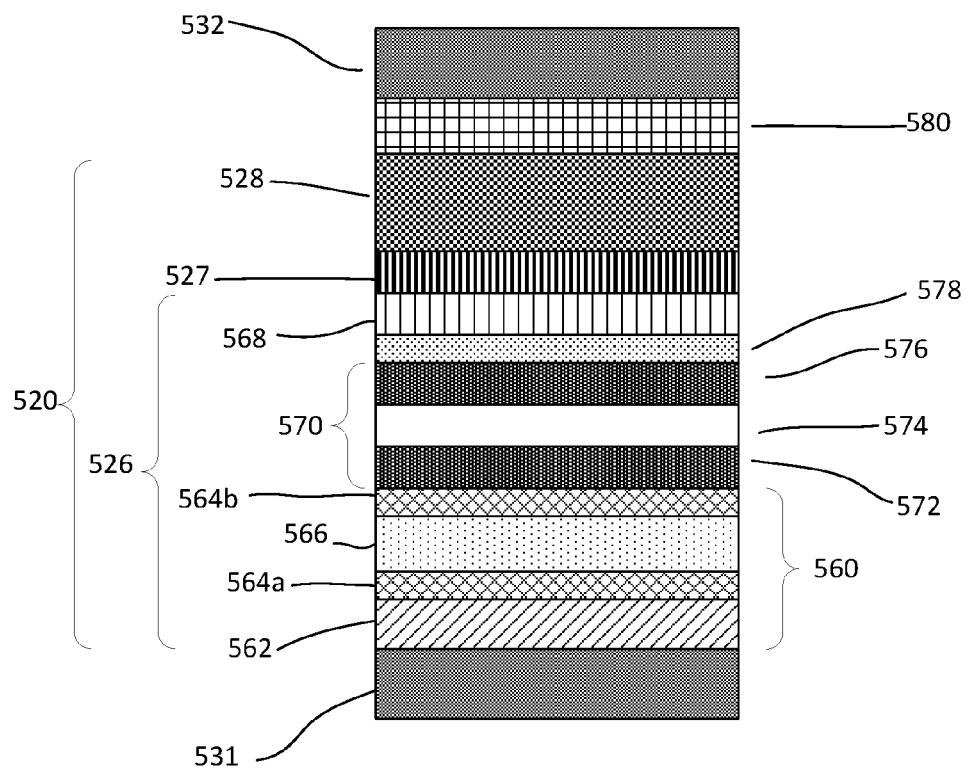
FIGS. 5a-5b show cross-sectional views of embodiments of a storage unit of magnetic memory cell.

FIG. 5a shows a cross-sectional view of an embodiment of a magnetic storage unit 510a of a magnetic cell. In one embodiment, the storage unit includes a bottom pinned pMTJ stack 520 disposed between bottom and top electrodes 531 and 532. The pMTJ stack or element includes a fixed layer 526, a free layer 528, and a tunneling barrier layer 527 separating the fixed layer from the free layer. As shown, the fixed layer is disposed below the free layer, forming the bottom pinned pMTJ element. A capping layer 580 is disposed over the free layer. The fixed layer, tunneling barrier layer and the free layer form the pMTJ stack 520.

The top and bottom electrode layers may be formed of a conductive material. In one embodiment, the top and bottom electrode may be formed of Ta. Other suitable types of electrodes may also be useful. For example, Ti, TaN, TiN or a combination of different electrode materials, including Ta, may also be useful. Furthermore, it is understood that the top and bottom electrodes need not be of the same material. A thickness of the electrode layers may be about 1 to 100 nm. The electrodes may be formed by physical vapor deposition (PVD). Other deposition techniques may also be useful.

The various layers of the MTJ element will be described. For example, the various layers will be described from the bottom electrode up to the top electrode.

The fixed layer is a fixed layer stack which includes a base layer 560, a hard layer 570 and a reference layer 568. In one embodiment, a spacer layer 578 is provided between the hard layer and the reference layer.

The base layer promotes orientation of the hard layer in a desired crystal structure or orientation. The base layer promotes crystal orientation of the hard layer in a desired orientation to increase perpendicular magnetic anisotropy (PMA). In one embodiment, the base layer promotes face-centered cubic (FCC) crystal structure of the hard layer along (111) orientation.

In one embodiment, the base layer includes a wetting layer 562 and a seed layer 564. The wetting layer promotes adhesion between the bottom electrode layer and the seed layer. In one embodiment, the wetting layer enhances the FCC structure of the seed layer along (111). This increases PMA. The wetting layer, in one embodiment, promotes a FCC structure along the (111) orientation. In one embodiment, the wetting layer is a Mg layer. The wetting layer may be formed by PVD. The thickness of the wetting layer may be about 1 nm. Other thicknesses may also be useful.

In other embodiments, the wetting layer may include multiple layers. The multiple layers include Mg and other layers which together promote FCC structure along the (111) orientation. For example, the multiple layers may include layers selected from Mg, layers having a BCC structure along (110) orientation and layers having a HCP structure along the (0002) orientation. Layers having a BCC (110) include Mo, Cr, W, Nb and V layers while layers having a HCP (0002) wetting layer may include Hf and Ru layers. Other suitable types of BCC (110) and HCP (0002) layers may also be used as the wetting layer as long as these layers promote FCC crystal structure of the hard layer along (111) orientation.

In one embodiment, the seed layer includes a roughness smoother 566 between first and second seed layers 564a and 564b. A seed layer, in one embodiment, includes multiple bilayers, forming a multi-bilayered seed stack or seed layer. For example, the first seed layer includes multiple bilayers and the second seed layers include multiple bilayers. By providing a seed layer having multiple layers, a thinner seed layer may be achieved compared to conventional seed layers. For example, the total thickness of the seed layer, including the first and second seed layers and roughness smoother, is about 5 nm or less. It is understood that the thickness of the first and second seed layers need not be equal. A thinner seed layer reduces total interface or surface roughness of the fixed layer. The reduced interface roughness improves thermal endurance, for example at about 400° C. This enables compatibility with complementary metal oxide semiconductor (CMOS) processes.

A multi-bilayered seed layer has a desired texture to produce strong PMA. In one embodiment, the texture of a multi-bilayered seed layer has a FCC structure along the (111) orientation. A bilayer of the seed stack, in one embodiment, includes a first layer Y having a thickness t1 and a second layer X having a thickness t2. The first layer Y, for example, may be disposed below the second layer X. The thickness t1 may be less than a mono layer and t2 may be less than a mono layer. For example, t1 may be from about 1.5 to 3.5 A and t2 may be about 1.5 to 3.5 A. The layers of the bilayers may be formed by PVD.

In one embodiment, the multi-bilayered seed layer is defined by $(Y_{t1}/X_{t2})_n$, where
t1 is the thickness of layer Y,
t2 is the thickness of layer X, and
n=the number of bilayers.
The value of n may be from about 2-20. The total thickness T of a seed layer is equal to (t1+t2)*n. For the first seed layer, n may be designated as n1 and for the second seed layer, n may be designated as n2. In one embodiment, the total thickness T of the seed layer, including the roughness smoothness, is about 5 nm or less.

In one embodiment, layer Y is a magnetic layer. For example, layer Y may be Ni, CoNi or NiFe. Other types of magnetic layers may also be useful. As for layer X, it is a non-magnetic layer having a BCC structure along the (110) orientation with high recrystallization temperature. Providing a non-magnetic layer having a BCC structure in the (110) orientation with high recrystallization temperature improves thermal endurance. Layer X, for example, is a Mo, Cr, W, Nb or V layer. In one embodiment, a bilayer of the seed layer may be Ni/Cr. For example, the seed layer is formed of $(Ni/Cr)_n$. Other suitable types of bilayers may also be useful. For example, other combinations of Y and X may be selected. It is understood that not all bilayers of the seed layer need to be the same.

As for the roughness smoother 566, it improves the surface smoothness of the first seed layer 564a. The roughness smoother produces a smooth surface less than 4 A RMS. Preferably, the roughness smoother produces a smooth surface less than 1 A RMS. In one embodiment, the roughness smoother is a surfactant layer. The surfactant layer improves surface smoothness of the first seed layer.

The surfactant layer, in one embodiment, includes first and second surfactant layers. The first surfactant layer is a layer with small atoms for filling gaps to clean the interface while the second surfactant layer is deposited over it. The surfactant layer, for example, may be MgTa. For example, Mg fills the gaps on the surface of the first seed layer to clean the interface while Ta is deposited over it. Other suitable types of surfactant layers may also be useful. For example, MgMo or MgW may serve as a surfactant layer. For example, the surfactant layer may be MgX, where X is Ta, Mo or W. The thickness of the surfactant layer should be thin to avoid magnetic decoupling between first and second seed layers. The thickness of the first surfactant layer (e.g., Mg) may be about 2 to 6 A while the thickness of the second surfactant layer (e.g., Ta) may be about 3 to 6 A.

In another embodiment, the roughness smoother includes a surface treatment to improve surface smoothness. For example, a plasma treatment may be performed on the top surface of the first seed layer to reduce surface roughness or to improve surface smoothness of the first seed layer. The plasma treatment may include an Ar plasma sputter back etch to smoothen the surface of the seed layer. The plasma etch for example, includes flow between 1 sccm to 100 sccm for about 1 to 250 seconds. Other suitable plasma treatment parameters may also be used.

The hard layer 526 is formed over the base layer 560. For example, the hard layer is formed over the seed layer of the base layer. The hard layer, in one embodiment, is a composite hard layer with multiple layers to form a hard layer stack. In one embodiment, the hard layer includes a synthetic antiferromagnetic (SAF) layer 570. The SAF layer, in one embodiment, is a composite SAF layer which includes first and second antiparallel (AP) layers 572 and 576 separated by a coupling layer 574. For example, the first AP (AP1) layer and the second AP (AP2) layer are separated by the coupling layer.

In one embodiment, the AP layers are configured with a FCC structure along the (111) orientation. The (111) orientation, as discussed, is facilitated by the base layer. The first and second AP layers have magnetization directions which are antiparallel. For example, the AP1 layer has a first perpendicular magnetization direction which is the opposite of the second perpendicular magnetization direction of the AP2 layer. For example, the perpendicular magnetization of the first layer is downwards while the second perpendicular magnetization direction is upwards.

An AP layer may include multiple AP bilayers, forming an AP bilayered stack or layer. A bilayer of an AP layer may be cobalt/nickel (Co/Ni). For example, a Co/Ni bilayer includes a layer of nickel which is disposed over a layer of cobalt. Other types of AP layers, such as CoFe/Ni or CoFeB/Ni, may also be useful. The sequence of layer of an AP layer can have any sequence. In one embodiment, the Ni layer is the uppermost layer of the AP layer. For example, depending on the configuration, upper most layer may be a bilayer with Ni as at the top or a single layer of Ni.

As for the coupling layer, it serves to promote Ruderman-Kittle-Kasuya-Yosida (RKKY) coupling. The coupling layer, in one embodiment, is a ruthenium (Ru) layer. Providing other types of coupling layers may also be useful. The various layers of the SAF layer may be formed by PVD.

In one embodiment, a spacer layer 578 is provided between the second AP layer and reference layer 568. The spacer layer, for example, serves as a texture breaking layer. The spacer layer facilitates a different texture for the reference layer. For example, the spacer layer enables the reference layer having a different texture from that of the hard layer. For example, the spacer layer enables the reference layer to be amorphous when deposited. In one embodiment, the spacer layer may be a tantalum (Ta) layer. The thickness of the spacer layer should be thin to maintain magnetic coupling between the second AP layer and reference layer. The spacer layer, for example, may be about 1 to 6 A thick.

The reference layer, in one embodiment, is a magnetic layer. The reference layer, for example, is a cobalt-iron-boron (CoFeB) layer. Other suitable types of magnetic reference layers may also be useful. In one embodiment, the reference layer is deposited by, for example, PVD. The reference layer is deposited as an amorphous layer. Depositing the layer as an amorphous layer enhances TMR when it is subsequently recrystallized. For example, a post anneal is performed on the MTJ stack. The reference layer should be sufficiently thick without sacrificing the perpendicular magnetic anisotropy (PMA). The thickness of the reference layer, for example, may be about 5 to 13 A thick. Forming the reference layer using other techniques or processes as well as other thicknesses may also be useful.

The tunneling barrier layer 527 which is disposed over the hard layer may be a magnesium oxide (MgO) layer. Other suitable types of barrier layers may also be useful. The tunneling barrier layer may be formed by PVD. The thickness of the tunneling barrier layer may be about 8-20 A. Preferably, the thickness of the tunneling barrier layer is about 1-12 A. Other forming techniques or thicknesses for the tunneling barrier layer may also be useful.

The free or storage layer 528 is disposed over the tunneling barrier layer 527. The storage layer is a magnetic layer. In one embodiment, the storage layer may be a CoFeB layer. The storage layer may be a single layer or a composite layer. The thickness of the storage layer may be about 10-20 A to maintain PMA. In the case of a composite free layer, it may include a magnetic/non-magnetic/magnetic stack. The magnetic layer may be CoFeB while the non-magnetic layer may be Pd or Pt. The thickness of the non-magnetic layer is thin to avoid magnetic decoupling of the magnetic layer of the composite storage layer. The storage layer may be formed by, for example, PVD. Other techniques for forming the storage layer or thicknesses may also be useful.

A capping layer 580 is provided over the storage layer. The capping layer, for example, serves to minimize the top electrode diffusion through the tunneling barrier or magnetic layers. The capping layer, for example, may be a Ru layer or a Ta layer. Providing a composite capping layer may also be useful. For example, the capping layer may include Ru and Ta layers. In one embodiment, the capping layer may include a Ru/CoFe/Ta or a Ru/CoFeB/Ta composite layer. In the case of the composite capping layer, the Ru layer may be about 10 A thick, the CoFeB or CoFe layer may be about 15 A and the Ta layer may be about 100 A. Other configurations of capping layers may also be useful. The capping layer may be formed by, for example, PVD.

Figure 5B:
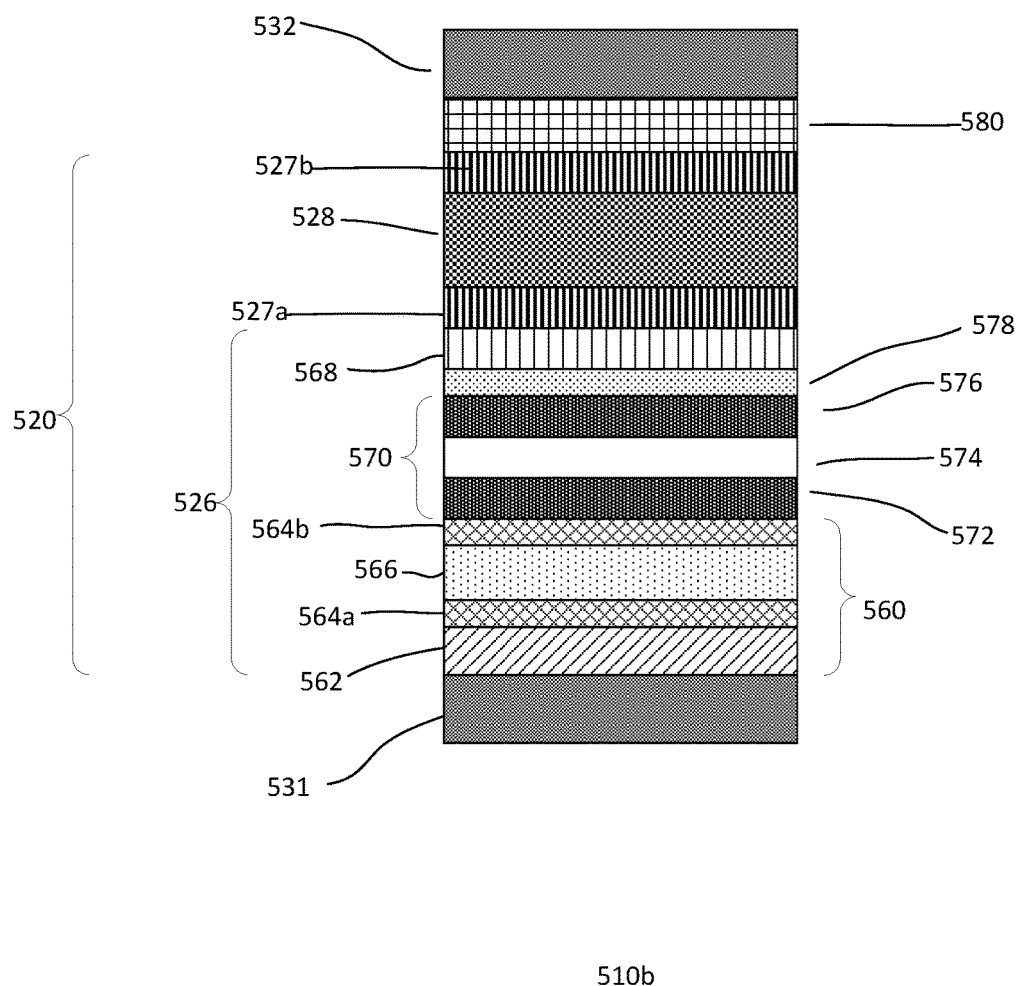

FIG. 5b shows a cross-sectional view of another embodiment of a magnetic storage unit 510b of a magnetic memory cell. In one embodiment, the storage unit includes a bottom pinned pMTJ stack or element 520 disposed between bottom and top electrodes 531 and 532. The pMTJ element is similar to that described in FIG. 5a. Common elements may not be described or described in detail.

The pMTJ element includes a fixed layer 526, a free layer 528, and a tunneling barrier layer separating the fixed layer from the free layer. The fixed layer is disposed below the free layer, forming the bottom pinned pMTJ element. A capping layer 580 is disposed over the free layer. The fixed layer, tunneling barrier layer, and free layer form the pMTJ element.

In contrast to the pMTJ element 510a of FIG. 5a, the pMTJ element 510b of FIG. 5b includes first and second tunneling barrier layers 527a and 527b. This configuration produces a dual tunneling barrier pMTJ element. In one embodiment, the free layer 528 is disposed in between the first and second tunneling barrier layers 527a-527b. The tunneling barrier layers, for example, may be MgO tunneling barrier layers. Other suitable types of tunneling barrier layers may also be useful. It is also understood that the tunneling barrier layers need not be the same. As for the other layers of the pMTJ element, they are the same or similar.

In one embodiment, the first tunneling barrier layer has resistance area (RA) of about 9 Ohms/um$^2$ while the second tunneling barrier layer has a RA of about 0.5 Ohms/um$^2$. The second tunneling barrier enhances anisotropy of the storage layer, increasing thermal stability. Additionally, the second tunneling barrier reduces the damping effect of the storage layer, reducing switching current.

Figure 6A:
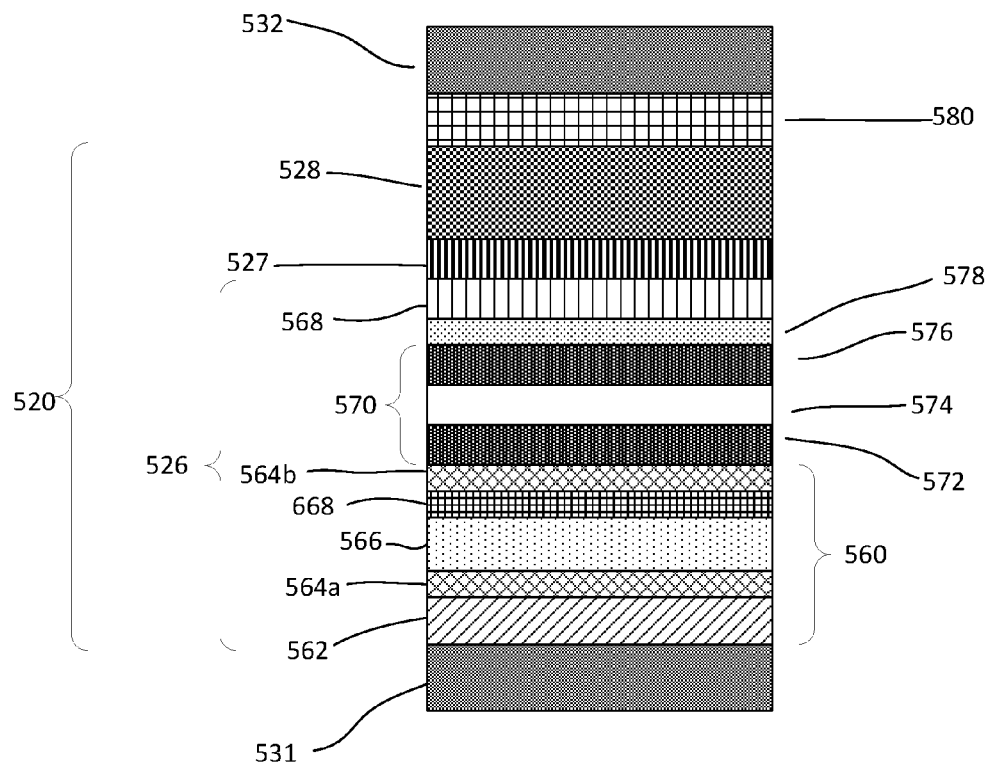
FIGS. 6a-6b show cross-sectional views of embodiments of a storage unit of magnetic memory cell.

FIG. 6a shows a cross-sectional view of another embodiment of a magnetic storage unit 610a of a magnetic memory cell. In one embodiment, the storage unit includes a bottom pinned pMTJ stack or element 520 disposed between bottom and top electrodes 531 and 532. The pMTJ element is similar to that described in FIG. 5a. Common elements may not be described or described in detail.

The pMTJ element includes a fixed layer 526, a free layer 528, and a tunneling barrier layer 527 disposed between the fixed layer and the free layer. The fixed layer is disposed below the free layer, forming the bottom pinned pMTJ element. A capping layer 580 is disposed over the free layer. The fixed layer, tunneling barrier layer, and free layer form the pMTJ element 520.

In contrast to the pMTJ element 510a of FIG. 5a, the pMTJ element 610a of FIG. 6a includes a crystallinity enhancing layer 668 disposed between the roughness smoother 566 and the second seed layer 564b. The crystallinity enhancing layer serves to enhance FCC structure along (111) orientation of the second seed layer. The crystallinity enhancing layer, in one embodiment, is a Mg layer. Other suitable types of layers which enhances crystallinity of the fixed layer to have a FCC structure along the (111) orientation may also be useful. For example, the crystallinity enhancing layer may have a BCC structure along (110) orientation or a HCP structure along the (0002) orientation. Layers having a BCC (110) include Mo, Cr, W, Nb and V layers while layers having a HCP (0002) include Hf and Ru layers. Other suitable types of BCC (110) and HCP (0002) layers may also be used. The crystallinity enhancing layer may have a thickness of about 10-80 A and it may be formed by PVD. Other suitable thicknesses and forming techniques may also be useful.

Figure 6B:
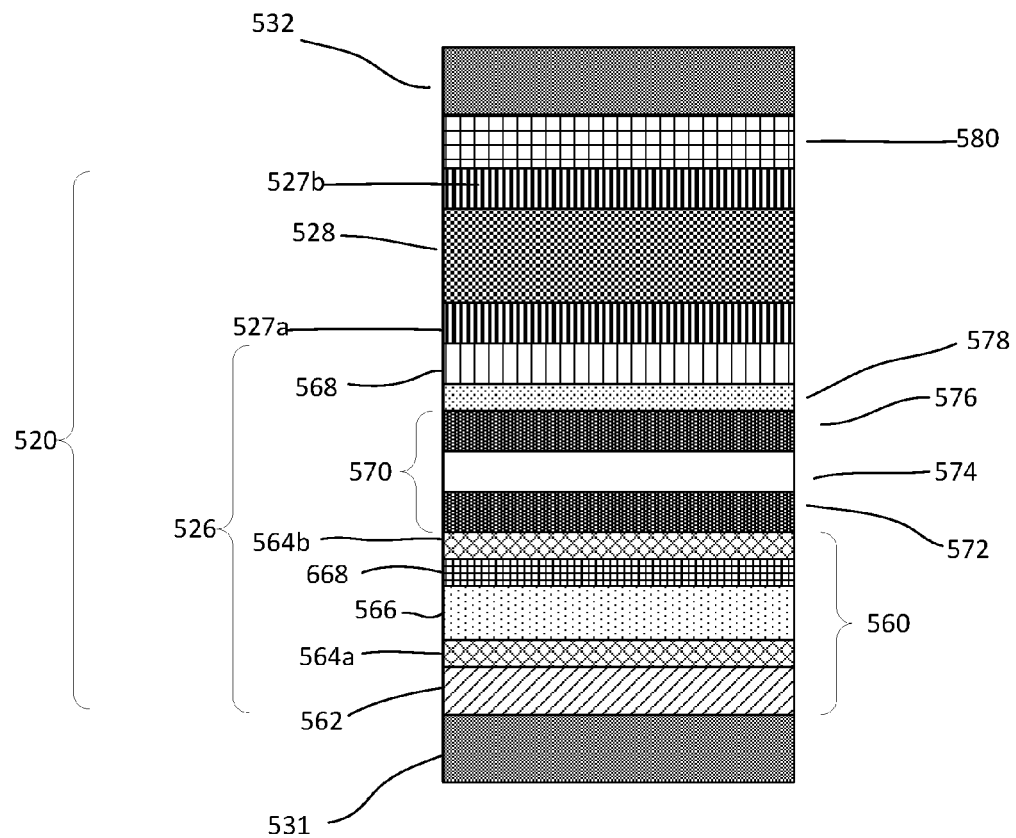

FIG. 6b shows a cross-sectional view of another embodiment of a magnetic storage unit 610b of a magnetic memory cell. In one embodiment, the storage unit includes a bottom pinned pMTJ stack or element 520 disposed between bottom and top electrodes 531 and 532. The pMTJ element is similar to that described in FIGS. 5a-5b and 6a. Common elements may not be described or described in detail.

The pMTJ element includes a fixed layer 526, a free layer 528, and a tunneling barrier layer disposed between the fixed layer and the free layer. The fixed layer is disposed below the free layer, forming the bottom pinned pMTJ element. A capping layer 580 is disposed over the free layer. The fixed layer, tunneling barrier layer, and free layer form the pMTJ element 520.

In contrast to the pMTJ element 610a of FIG. 6a, the pMTJ element 610b of FIG. 6b includes first and second tunneling barrier layers 527a and 527b. This configuration produces a dual tunneling barrier pMTJ element. In one embodiment, the free layer 528 is disposed between the first and second tunneling barrier layers 527a-527b. The tunneling barrier layers, for example, may be MgO tunneling barrier layers. Other suitable types of tunneling barrier layers may also be useful. It is also understood that the tunneling barrier layers need not be the same. As for the other layers of the MTJ element, they are the same or similar.

The various layers of the pMTJ stack may be disposed on a dielectric layer of BEOL process. For example, the various layers of the pMTJ stack may be disposed on a metal level with the bottom electrode. After the layers are formed, they are patterned to form the pMTJ stack. Patterning may be achieved using, for example, mask and etch techniques. Such technique may include forming a patterned photoresist mask over the top of the stack and etching the layers of the MTJ stack using, for example, an anisotropic etch such as a reactive ion etch (RIE). The process may continue to form top electrode as well as other ILD levels of the BEOL process.

FIGS. 7a-7l show cross-sectional views of an embodiment of a process 700 for forming a device. The process includes forming a memory cell. The memory cell, for example, may be a magnetic random access memory (MRAM) cell. The memory cell, for example, is the same or similar to that described in FIG. 2 and includes an MTJ element as described in FIGS. 5a-5b and FIGS. 6a-6b. Common elements may not be described or described in detail.

The cross-sectional views, for example, are along the bit line direction. Although the cross-sectional views show one memory cell, it is understood that the device includes a plurality of memory cells of, for example, a memory array. In one embodiment, the process of forming the cell is highly compatible with CMOS logic process. For example, the cell can be formed simultaneously with CMOS logic devices (not shown) on the same substrate.

Figure 7A:
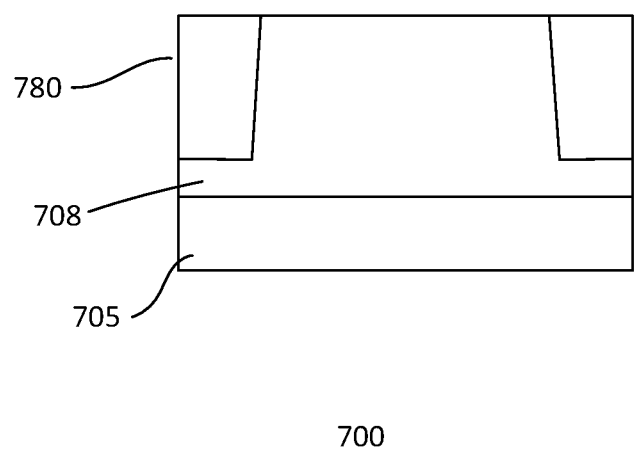

Referring to FIG. 7a, a substrate 705 is provided. The substrate, for example, is a semiconductor substrate, such as a silicon substrate. The substrate may be a lightly doped p-type substrate. Providing an intrinsic or other types of doped substrates, such as silicon germanium (SiGe), germanium (Ge), gallium arsenide (GaAs) or any other suitable semiconductor materials, may also be useful. In some embodiments, the substrate may be a crystalline-on-insulator (COI) substrate. A COI substrate includes a surface crystalline layer separated from a bulk crystalline by an insulator layer. The insulator layer, for example, may be formed of a dielectric insulating material. The insulator layer, for example, includes silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

The substrate is processed to define a cell region in which a memory cell is formed. The cell region may be part of an array region. For example, the array region may include a plurality of cell regions. The substrate may include other types of device regions, such as a logic region. Other types of regions may also be provided.

Isolation regions 780 are formed in the substrate. In one embodiment, the isolation regions are shallow trench isolation (STI) regions. Other types of isolation regions may also be useful. The isolation regions are provided to isolate device regions from other regions. The isolation regions may also isolate contact regions within a cell region. Isolation regions may be formed by, for example, etching trenches in the substrate and filling them with a dielectric material, such as silicon oxide. A planarization process, such as chemical mechanical polish (CMP), is performed to remove excess dielectric material, leaving, for example, STI regions isolating the device regions.

A doped well or device well 708 is formed. The well, for example, is formed after the isolation regions. In one embodiment, the well serves as a well for the select transistor of the selector unit. The well, for example, is a second polarity type doped well. The second polarity type is the opposite polarity type of the transistor of the cell selector unit. In one embodiment, the device well is a p-type well for a n-type cell select transistor, such as a metal oxide semiconductor field effect transistor (MOSFET). The device well serves as a body of the select transistor.

In one embodiment, an implant mask may be employed to implant the dopants to form the doped well. The implant mask, for example, is a patterned photoresist layer. The implant mask exposes regions of the substrate in which the second polarity wells are formed. The device well may be lightly or intermediately doped with second polarity type dopants. For example, the device well may have a dopant concentration of about 1E15 to 1E19/cm$^3$. Other dopant concentrations may also be useful. The well, for example, may be a common device well for the array.

The process may include forming other wells for other device regions. In the case where the wells are different polarity type of dopant concentration, they may be formed using separate processes, such as separate mask and implants. For example, first polarity typed doped wells, wells of different dopant concentrations as well as other wells may be formed using separate mask and implant processes.

Figure 7B:
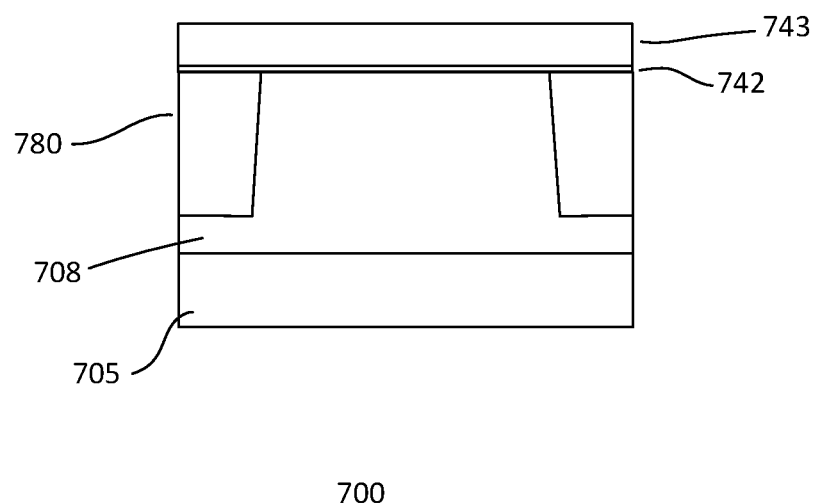

As shown in FIG. 7b, gate layers are formed on the substrate. The gate layers, in one embodiment, include a gate dielectric layer 742 and a gate electrode layer 743 thereover. The gate dielectric layer, for example, may be a silicon oxide layer. The gate dielectric may be formed by thermal oxidation. As for the gate electrode layer, it may be a polysilicon layer. The gate electrode layer may be formed by chemical vapor deposition (CVD). Other suitable types of gate layers, including high k dielectric and metal gate electrode layers, or other suitable techniques for forming gate layers may also be useful.

Figure 7C:
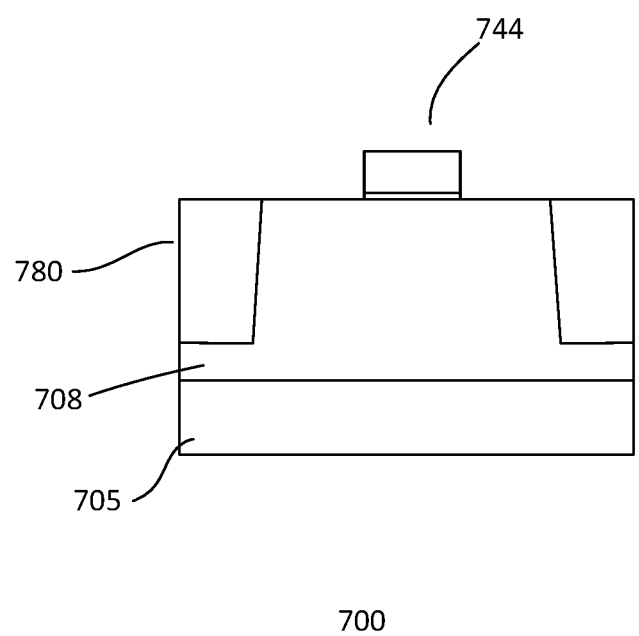

Referring to FIG. 7c, the gate layers are patterned to form a gate 744 of the select transistor of the select unit. Patterning the gate layers may be achieved using mask and etch techniques. For example, a soft mask, such as photoresist may be formed over the gate electrode layer. An exposure source may selectively expose the photoresist layer through a reticle containing the desired pattern. After selectively exposing the photoresist layer, it is developed to form openings corresponding to locations where the gate layers are to be removed. To improve lithographic resolution, an anti-reflective coating may be used below the photoresist layer. The patterned mask layer is used to pattern the gate layers. For example, an anisotropic etch, such as reactive ion etch (RIE), is used to remove exposed portions of the gate layers. Other types of etch processes may also be useful. The etch transfers the pattern of the mask layer to the underlying gate layers. Patterning the gate layers forms gate of the select transistor. The gate, for example, may be gate conductor along a first or word line direction. A gate conductor forms a common gate for a row of memory cells. It is understood that gates of the memory cells of the array may be formed.

Figure 7D:
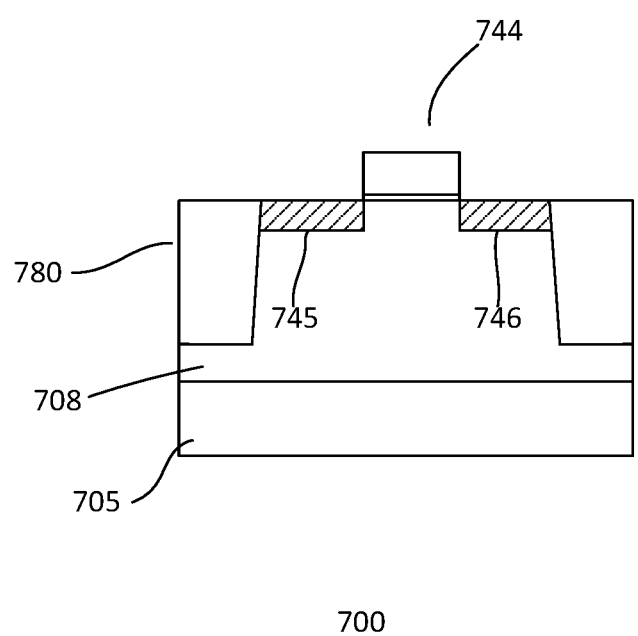

Referring to FIG. 7d, an implant is performed to first and second S/D regions 745 and 746 on sides of the gate. The implant, for example, implant first polarity type dopants to form first polarity type S/D regions. An implant mask (not shown) may be used to form the first polarity type S/D regions in the substrate. In one embodiment, the implant forms heavily doped first polarity type S/D regions in the substrate adjacent to the gates. The first polarity type dopants, for example, include n-type dopants. The implantation process to form the first polarity type S/D regions may be performed together while forming first polarity type S/D regions in other device regions (not shown) on the same substrate as well as first polarity type contact regions. The S/D regions, for example, include dopant concentration of about 5E19 to $1E21/cm^3$. Other dopant concentration may also be useful.

An LD extension implant may be performed to form LD extension regions (not shown) of the S/D regions. The LD extension implant may be performed prior to forming the S/D regions. An implant mask may be used to form the LD extension regions. To form the LD extension regions, first polarity type dopants are implanted into the substrate. The first polarity type dopants, for example, include n-type dopants. In one embodiment, the implant forms LD extension regions in the substrate adjacent to the gates. For example, the LD extension regions extend slightly under the gates and are typically shallower than the S/D regions. The LD extension regions, for example, include dopant concentration of about 1E18 to $5E19/cm^3$. Other dopant concentration may also be useful. In some embodiments, a halo region may also be formed. The halo region may be formed at the same time as the LD extension region. After forming the LD extension regions, sidewall spacers (not shown) may be formed on sidewalls of the gate followed by forming the S/D regions.

Separate implants for second polarity type S/D and extension regions may be performed. The second polarity type implants form S/D and extension regions for second polarity type transistors in other device regions as well as second polarity type contact regions.

Figure 7E:
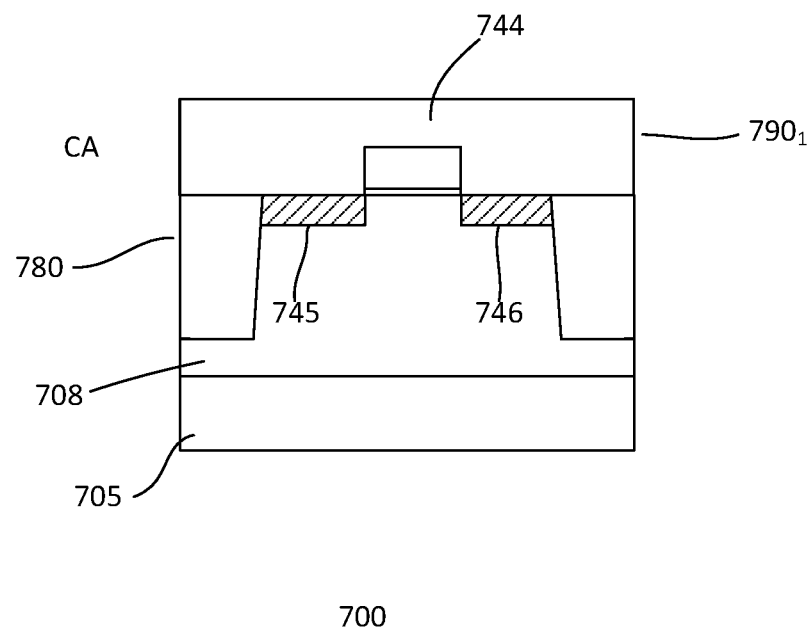

Referring to FIG. 7e, a dielectric layer 790$_1$ is formed on the substrate, covering the transistors. The dielectric layer, for example, serves as a dielectric layer of an ILD layer. For example, the dielectric layer serves as a PMD or CA level of an ILD layer. The dielectric layer, for example, is a silicon oxide layer. Other types of dielectric layers may also be useful. The dielectric layer may be formed by CVD. Other techniques for forming the dielectric layer may also be useful. A planarizing process may be performed to produce a planar surface. The planarizing process, for example, may include CMP. Other types of planarizing processes may also be useful.

Figure 7F:
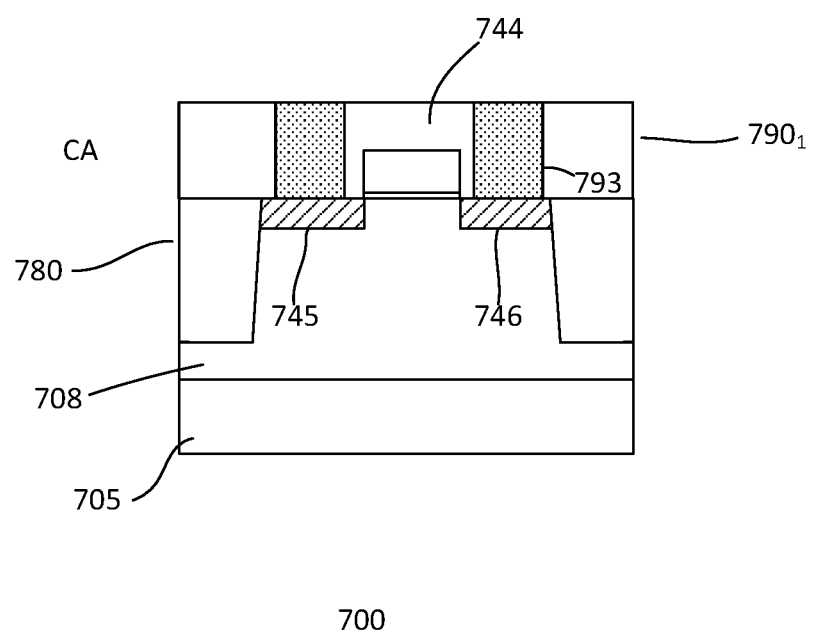

In one embodiment, contacts 793 are formed in the dielectric layer 790$_1$ as shown in FIG. 7f. The contacts, for example, connect to contact regions, such as S/D regions and gate (not shown). Forming the contacts may include forming contact vias in the dielectric layer to expose the contact regions. Forming the contact vias may be achieved using mask and etch techniques. After the vias are formed, a conductive material is deposited to fill the vias. The conductive material, for example, may be tungsten. Other types of conductive materials may also be useful. A planarization process, such as CMP, is performed to remove excess conductive material, leaving contact plugs in the contact vias.

Figure 7G:
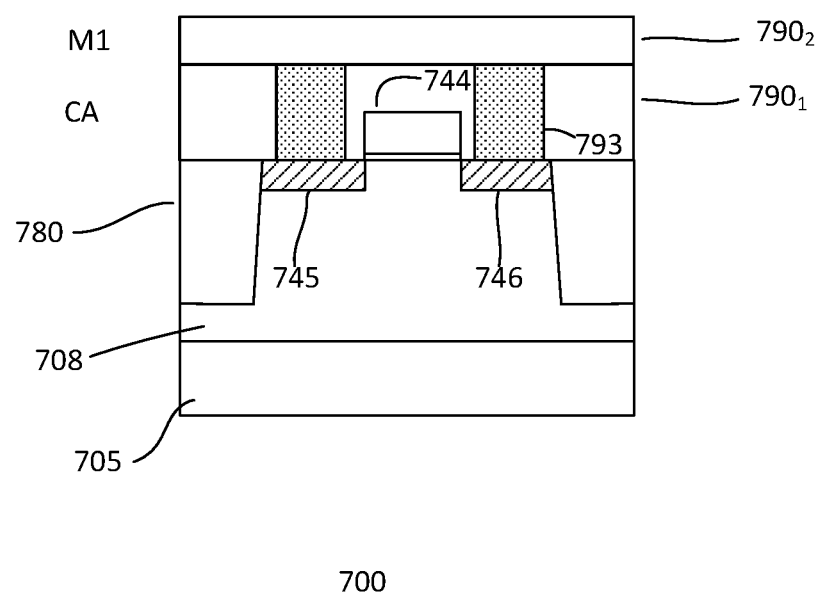

In FIG. 7g, a dielectric layer 790$_2$ is formed over the substrate, covering the lower dielectric layer 790$_1$. The dielectric layer, for example, serves as a metal level of an ILD layer. In one embodiment, the dielectric layer serves as M1 level of the ILD layer. The dielectric layer, for example, is a silicon oxide layer. Other types of dielectric layers may also be useful. The dielectric layer may be formed by CVD. Other techniques for forming the dielectric layer may also be useful. Since the underlying surface is already planar, a planarizing process may not be needed. However, it is understood that a planarization process, such as CMP, may be performed if desired to produce a planar surface.

Figure 7H:
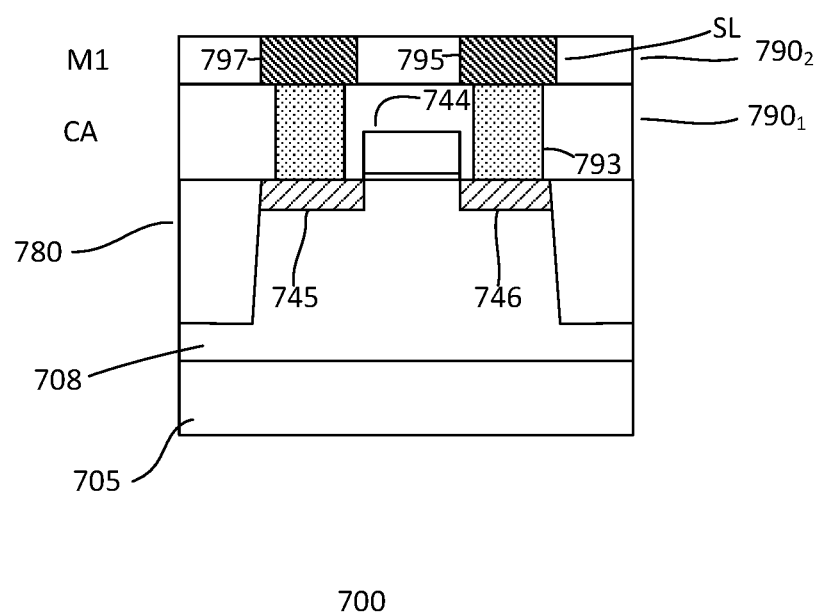

In FIG. 7h, conductive or metal lines 795 are formed in the dielectric layer 790$_2$. The conductive lines may be formed by damascene technique. For example, the upper dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful. In one embodiment, a source line SL is formed to connect to the source region 746 of the transistor while other interconnects, such as interconnect pad 797 formed in M1 is coupled to the drain region 745. The SL, for example, may be along the wordline direction. Providing SL in the bitline direction may also be useful. As for the interconnect pad, it may serve as a storage pad. Other conductive lines and pads may also be formed.

Figure 7I:
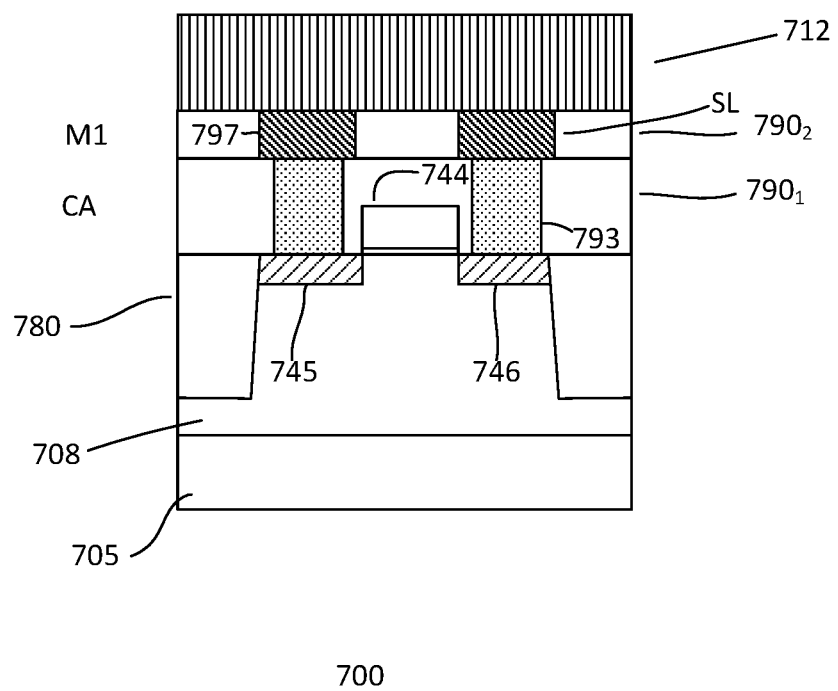
Figure 7J:
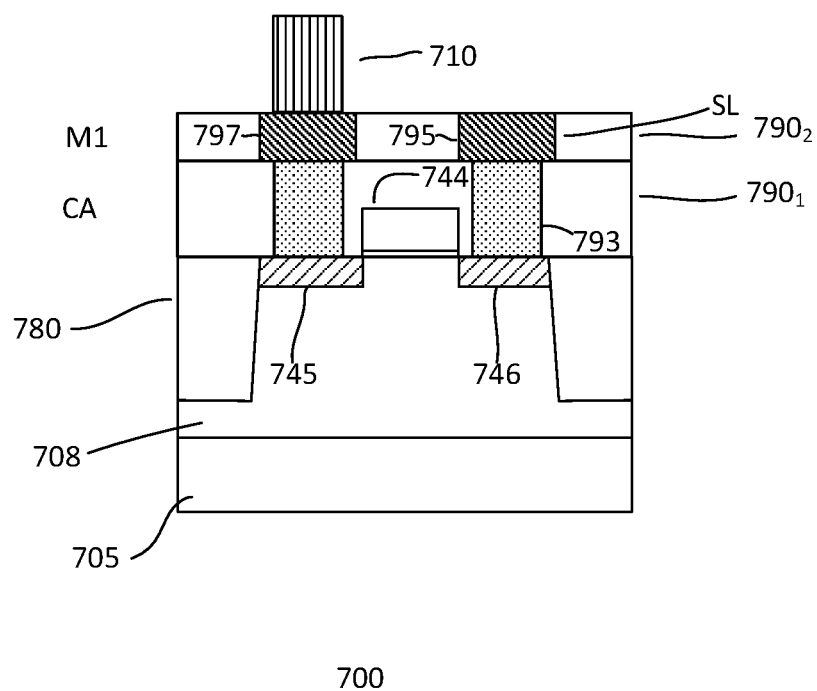

As shown in FIG. 7i, the process continues to form a storage unit of the memory cell. In one embodiment, the process forms various layers 712 of a storage unit with a pMTJ element. The various layers are formed on the dielectric layer 790$_2$. The layers may include layers as described in FIG. 5a, 5b, 6a or 6b. The layers may be formed by PVD or other suitable deposition techniques. The deposition technique may depend on the type of layer. The layers are patterned to form a storage unit 710 with a pMTJ element, as shown in FIG. 7j. Patterning the layers may be achieved using an anisotropic etch, such as RIE, with a patterned mask layer. Other techniques for forming the MTJ element may also be useful.

Figure 7K:
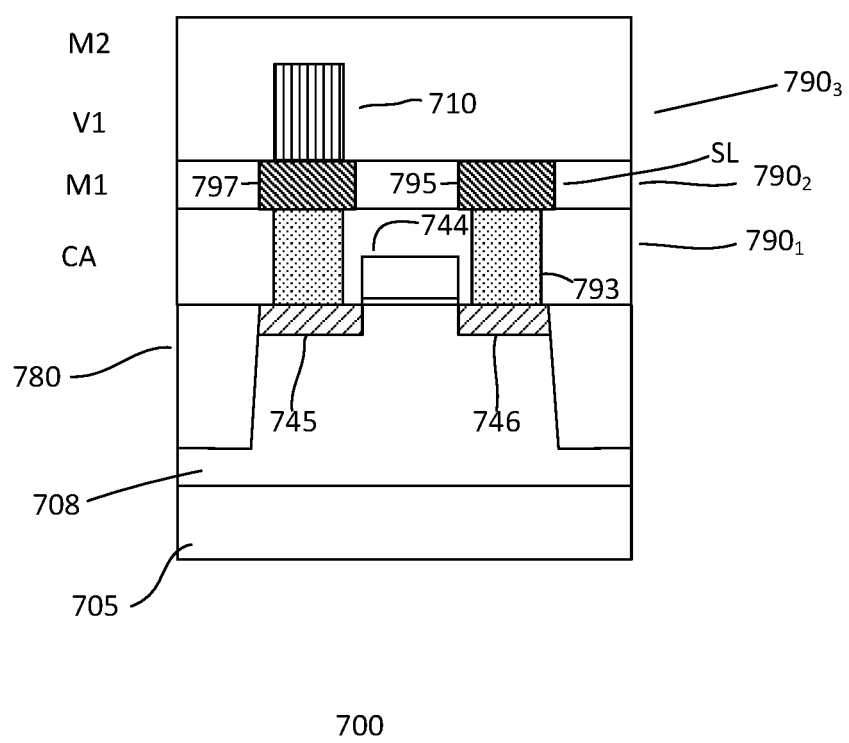
Figure 7I:
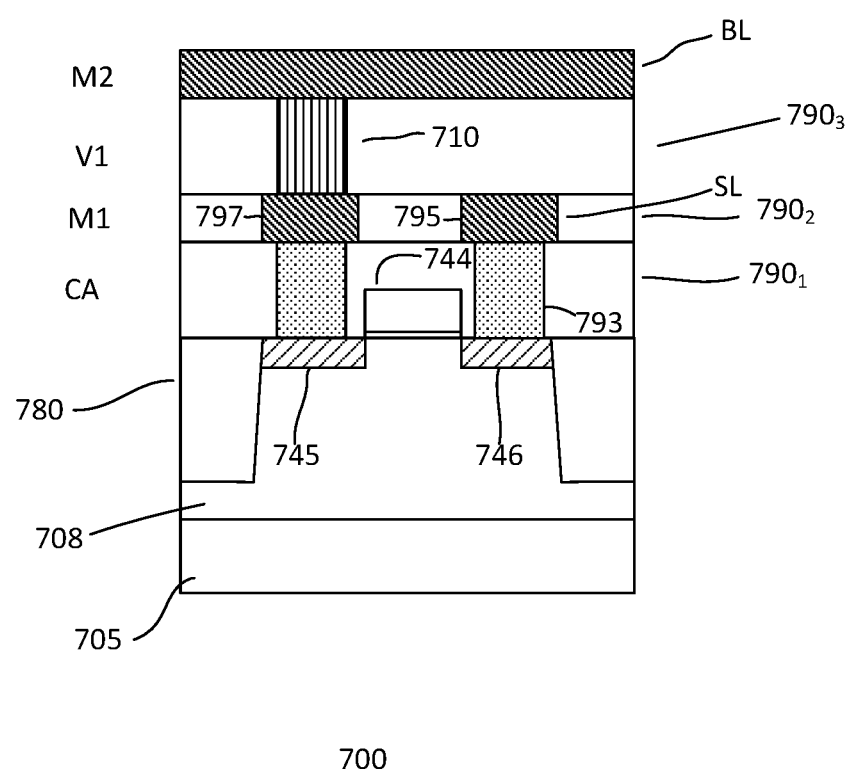

Referring to FIG. 7k, a storage dielectric layer 790$_3$ is formed over the MTJ storage unit. The dielectric layer covers the storage unit 710. The storage dielectric layer, for example, is a silicon oxide layer. The storage dielectric layer may be formed by, for example, CVD. Other types of storage dielectric layers or forming techniques may also be useful. A planarization process is performed to remove excess dielectric material to form a planar surface. The planarization process, for example, is CMP. As shown, the storage dielectric layer is disposed above the surface of the storage unit. For example, the storage dielectric layer includes V1 and M1 levels.

In FIG. 7l, a conductive or metal line is formed in the dielectric layer in M2. For example, a bitline BL is formed in M2 of the dielectric layer, coupling to the storage unit. Other metal lines may also be formed. The metal lines in M2 may be formed using a dual damascene technique.

Additional processes may be performed to complete forming the device. For example, the processes may include forming additional ILD levels, pad level, passivation level, pad opening, dicing, assembly and testing. Other types of processes may also be performed.

As described, the storage unit is formed in V1 and BL is formed in M2. Forming the storage unit and BL in other ILD levels, such as in an upper ILD level, may also be useful. In the case where the storage unit is provided in an upper ILD level, contact and interconnect pads may be formed in the intermediate ILD levels to connect to the storage unit. The contact and interconnect pads may be formed using dual damascene techniques.

In addition, a metal wordline may be provided in a metal layer above the gate. The metal wordline, for example, may be coupled to the gate of the select transistor. The metal wordline may be provided in M1 or other metal levels. For example, the metal wordline may be parallel with the SL. Also, as described, the various components are disposed in specific via or metal levels. It is understood that other configurations of the memory cell may also be useful. For example, the components may be disposed in other metal or via levels.

The embodiments as described result in various advantages. In the embodiments as described, the provision of the base layer having the seed layer with roughness smoother or crystallinity enhancing layer and wetting layer enhances the FCC structure along the (111) orientation of the fixed layer, thereby improving PMA of the fixed layer. Furthermore, the seed layer as described in this disclosure includes a reduced thickness without sacrificing PMA of the fixed layer. A thinner seed layer reduces total interface or surface roughness of the fixed layer. The reduced interface roughness improves thermal endurance of the pMTJ stack, for example at about 400° C. As a result, a pMTJ stack with improved thermal budget and PMA can be achieved. The seed layer with reduced thickness could also lead to a minimized pMTJ stack. Moreover, the process as described is highly compatible with logic processing or technology. This avoids investment of new tools and does not require creating new low temperature modules or processing, providing a cost effective solution.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a storage unit of a memory cell comprising:
    forming a bottom electrode;
    forming a fixed layer disposed over the bottom electrode, wherein the fixed layer comprises a hard layer disposed over a base layer, the base layer promotes face-centered cubic (FCC) structure along (111) orientation to increase perpendicular magnetic anisotropy, the base layer comprises
        a wetting layer, wherein the wetting layer comprises multiple layers which include Mg or Ru and layers having a BCC structure along (110) orientation or layers having a hexagonal close packed (HCP) structure along (0002) orientation which together promote the FCC structure along the (111) orientation, and
        a seed layer disposed over the wetting layer, wherein the seed layer comprises
            a first seed layer,
            a second seed layer formed over the first seed layer, the first and second seed layer form a seed bilayer defined as (Y/X), where Y is the first seed layer and is a magnetic layer and X is the second seed layer and a non-magnetic layer having a BCC structure along the (110) orientation with high recrystallization temperature, and
            a roughness smoother to improve surface smoothness of the seed layer, wherein the roughness smoother comprises first and second surfactant layers, wherein the first surfactant layer is a layer with small atoms for filling gaps to clean the interface while the second surfactant layer is deposited over the first surfactant layer;
    forming at least a first tunneling barrier layer over the hard layer;
    forming a storage layer over the first tunneling barrier layer; and
    forming a top electrode over the storage layer.

2. The method of claim 1 wherein:
    Y is selected from the group comprising Ni, CoNi and NiFe; and
    X is selected from the group comprising Mo, Cr, W, Nb and V.

3. The method of claim 2 wherein each of the first and second seed layers includes n seed bilayers, where n is ≥1, wherein the first layer Y of a seed bilayer includes a thickness t1 and the second layer X of a seed bilayer includes a thickness t2, and the n bilayers of the first or second seed layer is defined by $(Yt_1/Xt_2)_n$, and wherein a total thickness of the first or second seed layer is equal to (t1+t2) *n.

4. The method of claim 3 wherein n is about 2-20 and the total thickness of the seed layer which includes the first and second seed layers and the roughness smoother is about 5 nm or less.

5. The method of claim 1 wherein the surface smoother is disposed between the first and second seed layers.

6. The method of claim 3 wherein the hard layer comprises a synthetic antiferromagnetic (SAF) layer which includes first and second antiparallel (AP) layers separated by a coupling layer.

7. The method of claim 6 wherein an AP layer of the first and second AP layers comprises a bilayer and the AP layers are configured with a FCC structure along the (111) orientation facilitated by the base layer.

8. The method of claim 7 wherein the bilayer of the AP layer comprises Co/Ni, CoFe/Ni or CoFeB/Ni.

9. The method of claim 1 wherein the total thickness of the seed layer, including the roughness smoother, is about 5nm or less.

10. The method of claim 1 wherein the roughness smoother comprises a plasma treatment to improve surface smoothness of the first seed layer.

11. The method of claim 2 comprising forming a second tunneling barrier layer over the storage layer, wherein the first and second tunneling barrier layers form a dual tunneling barrier storage unit.

12. The method of claim 3 wherein the base layer further comprises a crystallinity enhancing layer formed between the roughness smoother and the second seed layer.

13. The method of claim 12 wherein the crystallinity enhancing layer comprises a Mg layer, or layer having a body-centered cubic (BCC) structure along (110) orientation or a hexagonal close packed (HCP) structure along (0002) orientation which enhances crystallinity of the fixed layer to have the FCC structure along the (111) orientation.

14. A method of forming a storage unit of a memory cell comprising:
forming a bottom electrode;
forming a fixed layer disposed over the bottom electrode, wherein the fixed layer comprises a hard layer disposed over a base layer, the base layer promotes face-centered cubic (FCC) structure along (111) orientation to increase perpendicular magnetic anisotropy, the base layer comprises
a wetting layer, wherein the wetting layer comprises multiple layers which include Mg and layers having a BCC structure along (110) orientation or layers having a hexagonal close packed (HCP) structure along (0002) orientation which together promote the FCC structure along the (111) orientation, and
a seed layer, wherein the seed layer comprises
a first seed layer,
a roughness smoother to improve surface smoothness of the first seed layer, and
a second seed layer formed over the roughness smoother, wherein the roughness smoother improves surface smoothness of the second seed layer, wherein improved surface smoothness of the seed layer improves surface smoothness of the hard layer to improve thermal endurance, wherein the roughness smoother comprises first and second surfactant layers, wherein the first surfactant layer is a layer with small atoms for filling gaps to clean the interface while the second surfactant layer is deposited over the first surfactant layer;
forming at least a first tunneling barrier layer over the hard layer;
forming a storage layer over the first tunneling barrier layer; and
forming a top electrode over the storage layer.

15. A method of forming a memory cell comprising:
forming a select unit on a substrate, wherein the select unit comprises a transistor having
a first source/drain (S/D) region,
a second S/D region, and
a gate between the first and second S/D regions;
forming a dielectric layer on the substrate covering the select unit, wherein the dielectric layer includes a storage pad coupled to the first S/D region;
forming a storage unit on the storage pad, wherein the storage unit comprises
forming a bottom electrode,
forming a fixed layer disposed over the bottom electrode, wherein the fixed layer comprises a hard layer disposed over a base layer, the base layer promotes face-centered cubic (FCC) structure along (111) orientation to increase perpendicular magnetic anisotropy, the base layer comprises
a wetting layer, wherein the wetting layer is a Mg layer or comprises multiple layers which include at least the Mg layer, and
a seed layer, wherein the seed layer comprises
a first seed layer, a roughness smoother to improve surface smoothness of the first seed layer, wherein the roughness smoother comprises first and second surfactant layers, wherein the first surfactant layer is a layer with small atoms for filling gaps to clean the interface while the second surfactant layer is deposited over the first surfactant layer,
a second seed layer formed over the roughness smoother, wherein the roughness smoother improves surface smoothness of the second seed layer, wherein improved surface smoothness of the seed layer improves surface smoothness of the hard layer to improve thermal endurance, and
forming at least a first tunneling barrier layer over the hard layer,
forming a storage layer over the first tunneling barrier layer, and
forming a top electrode over the storage layer; and
forming a bitline coupled to the top electrode layer.

16. A storage unit of a memory cell comprising:
a bottom electrode;
a fixed layer disposed over the bottom electrode, wherein the fixed layer comprises a hard layer disposed over a base layer, the base layer promotes face-centered cubic (FCC) structure along (111) orientation to increase perpendicular magnetic anisotropy, the base layer comprises
a wetting layer, wherein the wetting layer comprises multiple layers which include Mg or Ru and layers having a BCC structure along (110) orientation or layers having a HCP structure along (0002) orientation which together promote the FCC structure along the (111) orientation, and
a seed layer disposed over the wetting layer, wherein the seed layer comprises
a first seed layer,
a second seed layer disposed over the first seed layer, the first and second seed layer form a seed bilayer defined as (Y/X), where Y is the first seed layer and is a magnetic layer and X is the second seed layer and a non-magnetic layer having a BCC structure along the (110) orientation with high recrystallization temperature, and
a roughness smoother to improve surface smoothness of the seed layer, wherein the roughness smoother comprises first and second surfactant layers, the first surfactant layer is a layer with small atoms for filling gaps to clean the interface while the second surfactant layer is deposited over the first surfactant layer;
at least a first tunneling barrier layer disposed over the hard layer;
a storage layer disposed over the first tunneling barrier layer; and
a top electrode disposed over the storage layer.

17. The storage unit of claim 16 wherein:
Y is selected from the group comprising Ni, CoNi and NiFe; and
X is selected from the group comprising Mo, Cr, W, Nb and V.

18. The storage unit of claim 17 wherein:
each of the first and second seed layers includes n seed bilayers, where n is ≥1;
the first layer Y of a seed bilayer includes a thickness t1;
the second layer X of a seed bilayer includes a thickness t2;
the n bilayers of the first or second seed layer is defined by $(Yt_1/Xt_2)_n$; and wherein a total thickness of the first or second seed layer is equal to (t1+t2) *n.

19. The storage unit of claim 16 comprising a second tunneling barrier layer over the storage layer.

20. The storage unit of claim 17 wherein:
the base layer further comprises a crystallinity enhancing layer disposed between the roughness smoother and the second seed layer; and
the surface smoother is disposed between the first and second seed layer.

* * * * *